United States Patent [19]
Yoo et al.

[11] Patent Number: 5,411,907
[45] Date of Patent: May 2, 1995

[54] CAPPING FREE METAL SILICIDE INTEGRATED PROCESS

[75] Inventors: Chue-San Yoo, Taipei; Jyh-Min Tsaur, Miao Li; Chong-Shi Chen, Chang-Hua; Pin-Nan Tseng, Taoyuan, all of Taiwan, Prov. of China

[73] Assignee: Taiwan Semiconductor Manufacturing Company, Hsinchu, Taiwan, Prov. of China

[21] Appl. No.: 937,735

[22] Filed: Sep. 1, 1992

[51] Int. Cl.$^6$ .......................................... H01L 21/265
[52] U.S. Cl. ..................... 437/44; 437/200; 437/247
[58] Field of Search ................. 437/44, 247, 200, 40, 437/41

[56] References Cited

U.S. PATENT DOCUMENTS

| | | | |
|---|---|---|---|
| 4,616,399 | 10/1986 | Ooka | 437/44 |
| 4,690,730 | 9/1987 | Tseng et al. | 437/41 |
| 4,808,544 | 2/1989 | Matsui | 437/44 |
| 4,885,259 | 12/1989 | Osinski et al. | 437/41 |
| 4,975,385 | 12/1990 | Beinglass et al. | 437/29 |
| 5,089,432 | 2/1992 | Yoo | 437/40 |
| 5,147,814 | 9/1992 | Takeuchi | 437/44 |

Primary Examiner—Olik Chaudhuri
Assistant Examiner—H. Jey Tsai
Attorney, Agent, or Firm—George O. Saile

[57] ABSTRACT

A method is described for fabricating a lightly doped drain MOS FET integrated circuit device with a peeling-free metal silicide gate electrode continues by annealing the gate oxide, the polysilicon layer and the metal silicide layer using a furnace process at a temperature more than about 920° C. and for a time of less than about 40 minutes. A pattern of lightly doped regions is formed in the substrate by ion implantation using the structures as the mask. A low temperature silicon dioxide layer is blanket deposited over the surfaces of the structure. The pattern of lightly doped regions is driven in while maintaining the low temperature silicon oxide over the metal silicide layer by annealing at a temperature of more than about 920° C. The blanket layer is etched to form a dielectric spacer structure upon the sidewalls of each of the gate electrode structures and over the adjacent portions of the substrate, and to remove the silicon oxide layer from the top surfaces of metal silicide layer. Heavily doped regions are formed. A passivation layer which includes a silicon oxide layer and a thicker dielectric layer is formed over the structures. The heavily doped regions are annealed to drivein the impurities at a temperature of more than about 920° C. while maintaining said passivation layer over said metal silicide layer.

19 Claims, 1 Drawing Sheet

CAPPING FREE METAL SILICIDE INTEGRATED PROCESS

BACKGROUND OF THE INVENTION (1) Field of the Invention

The present invention relates to methods for producing integrated circuit devices-having lightly doped drain MOSFET with refractory metal polycide gate structures.

(2) Description of Prior Art

The use of polycide gates or interconnect lines, that is a combination of layers of polysilicon and a refractory metal silicide is becoming very important as the industry moves to smaller device geometries or more compact design. In the past, polysilicon was satisfactory as the gate electrodes and for interconnecting lines. However, as these geometries become smaller, polysilicon has become too high in resistivity for these applications due to its impact on RC time delays and IR voltage drops. The use of a combination of refractory metal silicides with polysilicon has proven suitable because of its lower resistivity.

Silicides of certain refractory metals, i.e. tungsten, molybdenum, titanium, and tantalum have been proven to be suitable for use as a low resistance interconnect material for VLSI integrated circuit fabrication. The disilicides pair very well with heavily doped polysilicon to form polycide gates, because of the criteria of low resistivity and high temperature stability. Tungsten silicide has particularly been found to be capable of overcoming some shortcomings, such as self-passivation, good stability in wet chemical ambients, adhesion, and reproducibility in combination with polysilicon in production.

The preferred deposition technique of tungsten silicide is low pressure chemical vapor deposition. The oxidation characteristics of tungsten silicide as produced by this method are similar to those of polysilicon.

The peeling of the polycide film can happen frequently if care is not taken during processing and handling of the wafers. This in turn causes the low yield of the product. This peeling and/or less integrity of the silicide problems are often observed after thermal treatments especially under an oxidizing atmosphere.

The conventional polycide process forms sequentially the gate oxide layer by thermal oxidation, the polysilicon layer which is then doped, and the refractory metal silicide in situ. The refractory metal silicide and polysilicon layer deposition and the doping of the polysilicon are normally not done in the same reaction chamber. These layers are now anisotropically etched in the desired pattern of polycide gate structures. A furnace annealing step in oxygen causes the amorphous refractory metal silicide to change into its crystalline phase. During this annealing process, silicon dioxide is grown upon the surfaces of the polycide and exposed silicon substrate. A pattern of lightly doped regions in the substrate is formed by ion implantation using said gate electrode structures as the mask. The dielectric spacer is formed by blanket chemical vapor deposition of silicon dioxide, a heat densification step and an anisotropic etching of the silicon dioxide layer. The N+ implant is then carried out, followed by the conventional dopant annealing step. The result of this process is all too often the peeling of the refractory metal silicide.

The workers in the field have tried to overcome this problem by capping with silicon dioxide during the reaction of titanium with the underlying polysilicon layer such as shown by T. E. Tang et al in U.S. Pat. No. 4,690,730. This did suppress peeling for this type of process, however the major reason for the silicon dioxide layer is to prevent the titanium from being oxidized by oxygen.

C. S. Yoo in U.S. Pat. No. 5,089,432 has shown a method for overcoming the metal silicide peeling problem by providing a method with forms a silicon oxide cover layer over the metal silicide layer before the formation of the heavily doped source/drain regions. C. S. Yoo and T. H. Lin in Ser. No. 7/649,549 filed Feb. 1, 1991 have shown a method which uses ion implanted silicon ions into the metal silicide layer to overcome the peeling problems.

It is therefore an important object of this invention to provide a method for fabricating integrated circuits which overcomes this peeling problem and raises yields by using a capping free metal polycide intergrated process which only uses high temperature annealing steps when the metal silicide is covered with a suitable covering that is normally formed in the process sequence.

SUMMARY OF THE INVENTION

In accordance with the present invention, a method is described for fabricating a lightly doped drain MOSFET integrated circuit device which overcomes the problems described above in prior integrated circuit devices. The method begins by forming a pattern of gate electrode structures upon a semiconductor substrate which structures each includes a gate oxide, a polysilicon layer and a refractory metal silicide. The method for fabricating a lightly doped drain MOS FET integrated circuit device with a peeling-free metal silicide gate electrode continues by annealing the gate oxide, the polysilicon layer and the metal silicide layer using a furnace process at a temperature more than about 920° C. and for a time of less than about 40 minutes. A pattern of lightly doped regions is formed in the substrate by ion implantation using the structures as the mask. A low temperature silicon dioxide layer is blanket deposited over the surfaces of the structure. The pattern of lightly doped regions is driven in while maintaining the low temperature silicon oxide over the metal silicide layer by annealing at a temperature of more than about 920° C. The blanket layer is etched to form a dielectric spacer structure upon tile sidewalls of each of the gate electrode structures and over the adjacent portions of the substrate, and to remove the silicon oxide layer from the top surfaces of metal silicide layer. Heavily doped regions are now formed in the substrate by ion implantation using the gate electrode structures with spacer structures as the mask to produce the lightly doped drain under the spacer structure of an MOS FET device. This ion implantation is done without the conventional usage of a silicon dioxide protective surface covering to prevent ion implantation damage. A passivation layer which includes a silicon oxide layer and a thicker dielectric layer is formed over the structures. The heavily doped regions are annealed to drivein the impurities at a temperature of more than about 920° C. while maintaining said passivation layer over said metal silicide layer. Openings are made in the passivation layer and appropriate electrical connecting structures are made therethrough and over to electrically connect the gate electrode structures and source/drain elements to form the integrated circuit device.

DESCRIPTION OF THE PREFERRED EMBODIMENTS

Figure 1:
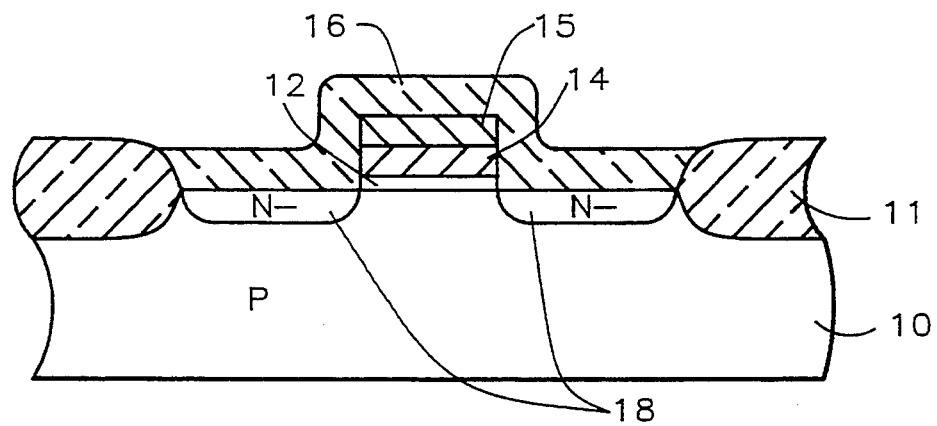
FIG. 1 through FIG. 3 schematically illustrate one method for making a lightly doped drain MOS FET polycide gate integrated circuit of the invention.
Figure 2:
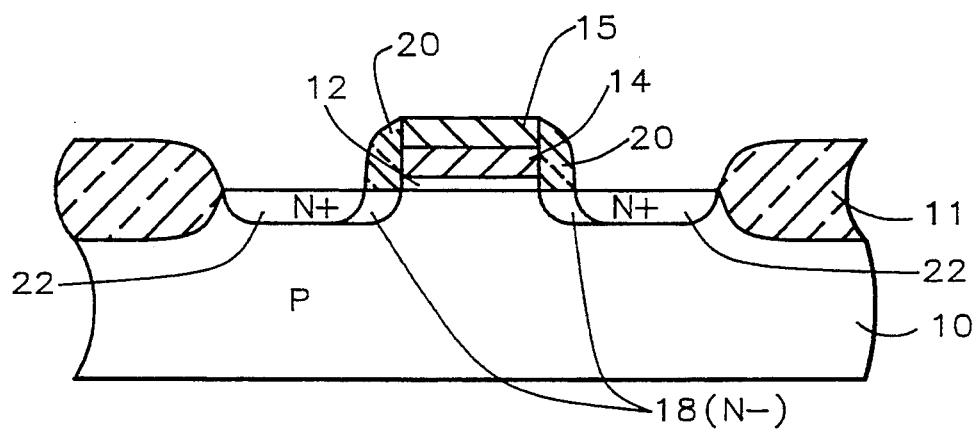
Figure 3:
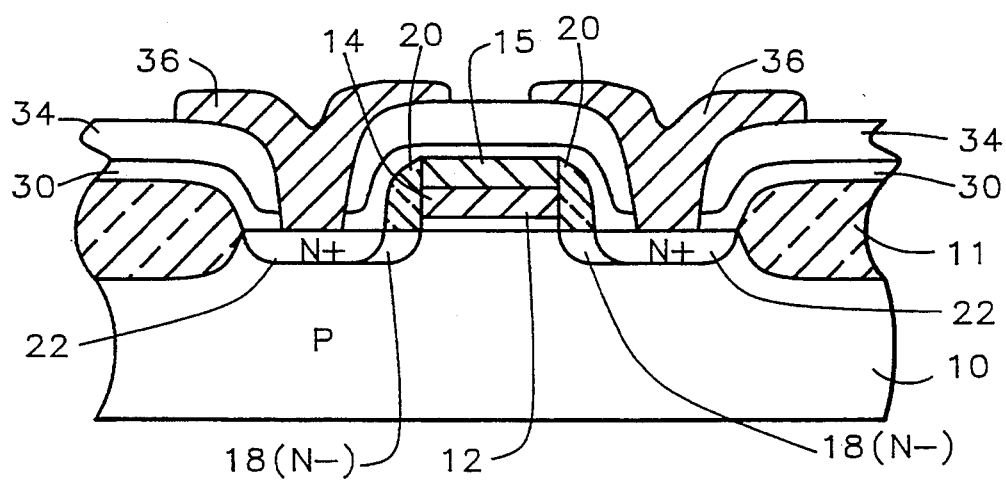

Referring now more particularly to FIGS. 1 through 3, there is shown a method for making the lightly doped drain device of the present invention. The first series of steps involve the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices have been shown schematically at 11 and will not be described in detail, because it is conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide 11 as shown in the FIG. 1. Then semiconductor devices can be provided in the silicon mesas according to the following processes.

The surface of the silicon substrate 10 is thermally oxidized to form the desired gate oxide 12 thickness. The preferred thickness is between about 1500 to 2000 Angstroms. The polysilicon layer 14 is blanket deposited by pyrolyzing silane between about 575° and 650° C. as is conventionally done. The preferred thickness of the polysilicon layer 14 is between about 2000 to 2500 Angstroms. The polysilicon layer 14 is doped with $POCl_3$, under the conditions of 850° C. for about 10 minutes of a soaking and 30 minutes of a drivein. The resulting surface is cleaned with a standard cleaning solution for polysilicon.

A refractory metal silicide layer, such as tungsten silicide 15 is preferably deposited using low pressure chemical vapor deposition over the polysilicon layer 14. The metal silicide is preferably deposited as amorphous.

The preferred metal silicide is tungsten silicide and the preferred deposition conditions are a gas flow of tungsten hexafluoride and silane at a temperature of about 360° C. and pressure of about 200 mTorr. in a suitable reactor. The flow rate of the silane is preferred to be about 2000 sccm. The thickness of the metal silicide is between about 2000 to 2250 Angstroms and the preferred thickness is 2000 Angstroms. Conventional lithography and etching is now used to form a lithographic mask over the polycide layered structure. The mask pattern protects the designated areas to be the polycide gate structures. The masked structure is now exposed to a plasma etching ambient of for example, $SF_6/C_2F_6$ under a pressure of about 250 mtorr. to remove the unwanted portions of the polysilicon layer 14 and refractory metal silicide layer 15. The resist mask is now removed.

The resulting polycide structure is annealed in an oxygen ambient using a temperature of at least 900° C. and preferably at least 920° C. for a time of between about 35 to 45 minutes. The preferred time is between about 40 minutes. The time and temperature conditions are critical to give the best possible adhesion of the polycide structure. This annealing process will cause the crystallization of the refractory metal silicide from its as deposited amorphous condition. The silicon oxide (not shown) formed on the polycide structures 14, 15 is about 400 Angstroms and about 150 Angstroms on the exposed silicon substrate 11. This silicon oxide (not shown) is left on the polycide top surface until the subsequent spacer etching which is often a 25% overetching step. The overetching will then remove this oxide layer.

The source/drain structure of the MOS FET may now be formed by the following steps. The FIGS. 1 through 3 illustrate the formation of an N channel FET integrated circuit device. However, it is well understood by those skilled in tile art that a P channel FET integrated circuit device could also be formed by simply substituting opposite polarities to those given for the N channel embodiment. Also, a CMOS FET could in a similar way be formed by making both N channel and P channel devices upon the same substrate. Of course, it may be desirable to form N or P wells as is known in the art in making such CMOS FET integrated circuit devices.

FIG. 1, for example shows the ion implantations of N-dopants. Lithographic masks (not shown) may be required to protect the areas not to be subjected to that particular N-ion implantation. The formation of the lithographic masks are done by conventional lithography and etching techniques. The N- lightly doped drain implantation 18 is done with for example phosphorous P31 implanting at a dose of 2 E 13 square cm. and with an energy of 75 Kev.

The dielectric spacer 20 will now be formed followed by the completion of the lightly doped drain source/drain structures and may be better understood with reference to FIGS. 1 and 2. A low temperature silicon dioxide deposition is preferred such as through the chemical vapor deposition of tetraethoxysilane (TEOS) at a temperature in the range of between about 650° to 750° C. However, it is generally preferred to have the spacer formation layer at the 700° C. The thickness of the dielectric silicon dioxide layer 16 is between about 2250 to 2750 Angstrom and preferably 2500 Angstroms.

The drivein of the lightly doped drain ion implantation is now done before the formation of the spacer. The metal silicide is still covered with the silicon dioxide layer 16 and will therefore be protected from peeling during this high temperature annealing step. The thermal annealing is at a temperature of at least 900° C. and preferably at least 920° C. for a time of between about 20 to 40 minutes. The prefered time is about 30 minutes. The time/temperature conditions are criticcal to optimizing this LDD structure. The resulting structure is shown in FIG. 1.

Now the anisotropic etching of this layer 16 is used to produce the dielectric spacer layer 20 on the vertical sidewalls of the polycide structures 14, 15. The silicon oxide layer (not shown) caused by the first annealing step is removed from the horizontal surfaces of the structure including the metal silicide layer 15. The preferred anisotropic etching uses a plasma dry etching apparatus with carbon hydrogen trifluoride and helium gases to etch the layer of silicon dioxide at a pressure of about 3 Tort.

The exposed silicon oxide layer 16 on the silicon substrate and the top surface of the metal silicide layer is also removed along with the unwanted portions of layer 16 by the reactive ion etching as can be seen by the FIG. 2. The lithographic mask (not shown) is removed by, for example plasma ashing in oxygen as is well known in the art.

Referring now to FIG. 2, the N+ source/drain ion implantation uses, for example Arsenic, As75 with a dose of 5 E 15 square cm. and energy of about 140 Kev. without the use of a screen silicon oxide layer as is conventionally used. The conventional drivein to complete the source/drain regions 22 that is normally done at this time is not done until the dielectric layer 30, 34 is deposited over the surfaces to protect the metal silicide layer portion of the polycide gate electrode.

The dielectric layer 30, 34 is deposited over the surfaces of the device. The dielectric layer 30, 34 which is preferably glasseous covers the polycide structure. The preferred process for forming the passivation layer 30, 34 is by forming in a continuous deposition, a layer 30 of between about 900 to 1100 Angstroms silicon dioxide and a second layer 34 of between about 3000 to 9000 Angstroms borophosphosilicate glass under either the conventional atmospheric pressure chemical vapor deposition or plasma enhanced chemical vapor deposition process.

The N+ drivein is now done by annealing. The metal silicide is still covered with the silicon dioxide layer 30 and dielectric layer 34 and will therefore be protected from peeling during this high temperature annealing step. The furnace thermal annealing is at a temperature of at least 850° C. and preferably at least 900° C. for a time of between about 20 to 50 minutes. The prefered time is about 40 minutes. This thermal process is critical in the recovery of damage down from the source/drain implantation and to give good borophophosilicate planarization.

Openings are required to be made to the source/drain regions 22. These are made by etching through the layer 30, 34 by conventional lithography and etching techniques. Openings (not shown) may also be made to the gate electrodes for this planned metallurgy level, but these are not shown because they are not in this cross-sectional drawing.

The structure is now heated to a temperature between about 850° to 920° C. to cause the glasseous layer to flow and to round off the sharp corners at the surface of the said contact openings. This is generally called reflow.

Appropriate metallurgy is now deposited and patterned to electrically connect and form contacts 36 to the gates (not shown) and source/drain elements 22 to complete this portion of the integrated circuit device. This metallurgy is conventional and may be formed of polysilicon, aluminium, aluminium with dopants of copper and/or silicon, polycide and the like.

The above detailed process description points out the important features of the present invention and to aid in the understanding thereof and variations may be made by one skilled in the art without departing from the spirit and scope of the invention. Workers in the art would normally believe that the source/drain implantation without using the screen silicon oxide may cause junction leakage and degrade device yield. However, with our detailed process approach, we surprisingly have residual implantation damages are away from device junction. Furthermore, our device performance and yield data with boron difluoride for P+ and arsenic for N+ have shown no significant degradation.

While the invention has been particularly shown and described with reference to the preferred embodiments, it will be understood by those skilled in the art that various changes in form and details may be made without departing from the spirit and scope of the invention. For example, while the detailed examples of the integrated circuit devices used N channel MOS FET devices, it is obvious to those skilled in the art that P channel devices and CMOS FET devices can also be fabricated as part of this invention. Further, bipolar devices can also be added to the integrated circuit device to form BIMOS or BICMOS structures.

What is claimed is:

1. The method for fabricating a lightly doped source/drain MOS FET integrated circuit device with a peeling-free metal silicide gate electrode comprising:

forming a pattern of gate electrode structures upon a semiconductor substrate which structures each includes a gate oxide, a polysilicon layer, and metal silicide layer;

forming a pattern of lightly doped regions in said substrate by ion implantation using said structures as the mask;

blanket depositing a dielectric layer over the surfaces of the structure at a temperature of between about 650° to 750° C.;

driving in said pattern of lightly doped regions while maintaining said dielectric layer over said metal silicide layer by annealing at a temperature of more than about 920° C.;

etching the said blanket layer to form a dielectric spacer structure upon the sidewalls of each of said gate electrode structures and over the adjacent portions of said substrate, and to remove the said dielectric layer from the top surfaces of said metal silicide layer;

forming heavily doped regions in said substrate by ion implantation using the said gate electrode structures with spacer structures as the mask to produce said lightly doped drain under said spacer structure of an MOS FET device and wherein the surface of said substrate being ion implanted is without using an ion protection covering layer;

forming a passivation layer over the said structures which passivation layer includes a layer of silicon oxide and a layer of a dielectric layer;

driving in said heavily doped regions by annealing at a temperature of more than about 900° C. while maintaining said passivation layer over said metal silicide; and forming openings in said passivation layer and making electrical connecting structures thereover to electrically connect the said gate electrode structures and source/drain elements to form said integrated circuit device.

2. The method of claim 1 wherein the said driving in said lightly doped drain regions annealing step is performed in an oxygen ambient at a temperature less than about 900° C. and for a time of between about 25 to 35 minutes.

3. The method of claim 1 wherein the said drivein annealing of said heavily doped regions is performed in a nitrogen ambient at a temperature about 900° C. and for a time of between about 35 to 45 minutes.

4. The method of claim 1 wherein the said metal silicide is deposited in situ by chemical vapor deposition.

5. The method of claim 4 wherein the said metal silicide is tungsten silicide.

6. The method of claim 1 wherein the thickness of the said metal silicide is between about 2000 to 2500 Angstroms, the said polysilicon layer is doped for conductivity and the thickness of said polysilicon layer is between about 2000 to 2500 Angstroms.

7. The method of claim 1 wherein the said lightly doped regions are N— doped and said heavily doped regions are N+ doped to form N channel MOS FET integrated circuit.

8. The method of claim 1 wherein said lightly doped source/drain MOS FET integrated circuit device include both P and N type devices on said substrate to provide CMOS FET circuit capability within said integrated circuit device.

9. The method of claim 1 wherein the thickness of said spacer structure is between about 2250 to 2750 Angstroms, and said spacer layer is formed by low temperature chemical vapor deposition at less than 750° C.

10. The method of claim 5 wherein the thickness of said tungsten silicide layer is between about 2000 and 2500 Angstroms and the thickness of the said polysilicon layer is between about 2000 and 2500 Angstroms.

11. The method of claim 1 wherein the said dielectric spacer structure is formed with a low temperature TEOS chemical vapor deposition method and an reactive ion anisotropic etching process to produce a said silicon dioxide spacer.

12. The method for fabricating a lightly doped source/drain MOS FET integrated circuit device having a peeling-free tungsten silicide gate electrode comprising:

forming a pattern of gate electrode structures upon a semiconductor substrate which structures each includes a gate oxide, a polysilicon layer, and a tungsten silicide;

annealing said gate oxide, said polysilicon layer and said silicide layer using an annealing process at a temperature more than about 920° C.;

forming a pattern of lightly doped regions in said substrate by ion implantation using said structures as the mask;

blanket depositing a dielectric layer over the surfaces of the structure at a temperature of between about 650° to 750° C.;

driving in said pattern of lightly doped regions by annealing at a temperature of more than about 920° C. and for a time of between about 25 to 35 minutes with said silicide layer having a covering of said dielectric layer thereover;

etching the said blanket layer to form a dielectric spacer structure upon the sidewalls of each of said gate electrode structures and over the adjacent portions of said substrate, and removing said dielectric layer from the top surface of said tungsten silicide layer;

forming heavily doped regions in said substrate by ion implantation using the said gate electrode structures with spacer structures as the mask to produce said lightly doped drain under said spacer structures of an MOS FET device and wherein the surface of said substrate being ion implanted is without using an ion protection covering layer;

forming a passivation layer over the structures which passivation layer includes a silicon oxide layer and a dielectric layer thereover;

driving in said heavily doped regions by annealing in an inert atmosphere at a temperature of more than about 900° C. with said silicide layer being covered with said passivation layer; and forming openings in said passivation layer and making electrical connecting structures thereover to electrically connect the said gate electrode structures and source/drain elements to form said integrated circuit device.

13. The method of claim 12 wherein the said driving in said lightly doped drain regions annealing step is performed in an oxygen ambient at a temperature of about 920° C.

14. The method of claim 12 wherein the said drivein annealing of said heavily doped regions is performed in a nitrogen ambient at a temperature of about 900° C.

15. The method of claim 12 wherein the said metal silicide is deposited in situ by chemical vapor deposition.

16. The method of claim 15 wherein the said metal silicide is tungsten silicide.

17. The method of claim 12 wherein the thickness of the said metal silicide is between about 2000 to 2500 Angstroms, the said polysilicon layer is doped for conductivity and the thickness of said polysilicon layer is between about 2000 to 2500 Angstroms.

18. The method of claim 12 wherein the said lightly doped regions are N— doped and said heavily doped regions are N+ doped to form N channel MOS FET integrated circuit.

19. The method of claim 16 wherein the thickness of said tungsten silicide layer is between about 2000 and 2500 Angstroms and the thickness of the said polysilicon layer is between about 2000 and 2500 Angstroms.

* * * * *